US011309015B2

(12) United States Patent
Ware et al.

(10) Patent No.: US 11,309,015 B2
(45) Date of Patent: *Apr. 19, 2022

(54) FLOATING BODY DRAM WITH REDUCED ACCESS ENERGY

(71) Applicant: Rambus Inc., San Jose, CA (US)

(72) Inventors: Frederick A. Ware, Los Altos Hills, CA (US); John Eric Linstadt, Palo Alto, CA (US); Zhichao Lu, San Jose, CA (US); Kenneth Lee Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/999,869

(22) Filed: Aug. 21, 2020

(65) Prior Publication Data
US 2021/0035623 A1 Feb. 4, 2021

Related U.S. Application Data

(63) Continuation of application No. 15/829,787, filed on Dec. 1, 2017, now Pat. No. 10,762,948.

(60) Provisional application No. 62/523,120, filed on Jun. 21, 2017, provisional application No. 62/432,496, filed on Dec. 9, 2016.

(51) Int. Cl.
G11C 11/34 (2006.01)
G11C 11/4091 (2006.01)
G06F 11/10 (2006.01)
G11C 11/4076 (2006.01)

(52) U.S. Cl.
CPC .......... *G11C 11/4091* (2013.01); *G06F 11/10* (2013.01); *G06F 11/1004* (2013.01); *G11C 11/4076* (2013.01); *G11C 2207/2263* (2013.01)

(58) Field of Classification Search
CPC ............ G11C 11/4091; G11C 11/4076; G11C 2207/2263; G06F 11/10; G06F 11/1004
USPC ....................................................... 365/182
See application file for complete search history.

(56) References Cited

U.S. PATENT DOCUMENTS

2007/0127289 A1* 6/2007 Lee .................. G11C 7/065
                                                        365/182
2012/0005557 A1* 1/2012 Mardiks ............... H03M 13/63
                                                        714/763
2016/0036466 A1* 2/2016 DeBrosse ........... G06F 11/1008
                                                        714/764

* cited by examiner

Primary Examiner — Tha-O H Bui
(74) Attorney, Agent, or Firm — Lance Kreisman; Peninsula Patent Group

(57) ABSTRACT

Memory devices, controllers and associated methods are disclosed. In one embodiment, a memory device is disclosed. The memory device includes storage cells that are each formed with a metal-oxide-semiconductor (MOS) transistor having a floating body. Data is stored as charge in the floating body. A transfer interface receives a read command to access data stored in a first group of the storage cells. Sensing circuitry detects the data stored in the first group of storage cells. The transfer interface selectively performs a writeback operation of the sensed data associated with the read command.

20 Claims, 8 Drawing Sheets

FLOATING BODY DRAM WITH REDUCED ACCESS ENERGY

CROSS-REFERENCE TO RELATED APPLICATIONS

This application is a Continuation that claims priority to U.S. Non-Provisional application Ser. No. 15/829,787, filed Dec. 1, 2017, entitled FLOATING BODY DRAM WITH REDUCED ACCESS ENERGY, which is a Non-Provisional that claims priority to U.S. Provisional Application No. 62/523,120, filed Jun. 21, 2017, entitled FLOATING BODY DRAM WITH REDUCED ACCESS ENERGY, and U.S. Provisional Application No. 62/432,496, filed Dec. 9, 2016, entitled FLOATING BODY DRAM WITH REDUCED ACCESS ENERGY, all of which are incorporated herein by reference in their entirety.

TECHNICAL FIELD

The disclosure herein relates to memory devices, memory controllers, and associated methods.

BACKGROUND

Various process technologies exist for producing dynamic random access memory (DRAM) devices. One fabrication scheme involves floating gates, where a given DRAM storage cell is formed from a silicon-on-insulator (SOI) transistor such that charge is stored in the body of the transistor, rather than in a trench or stack capacitor. The stored charge for a "floating body" DRAM creates a back-gate bias adjustment to the transistor threshold voltage.

Similar to a conventional trench or capacitive DRAM, access to a row of memory cells of a floating body DRAM (FBDRAM) is carried out via a row of sense amplifiers. However, the sense signal generated by a given FBRAM cell is significantly larger in magnitude than that of a trench or capacitor DRAM cell. As a result, FBDRAM sense amplifiers may be configured to operate at significantly lower power parameters.

While FBDRAMs have the ability of providing low-power advantages, signal attenuation associated with read operations may occur in certain circumstances.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Memory devices, controllers and associated methods are disclosed. One embodiment includes a memory device that employs storage cells with floating bodies such that data is stored as charge in each floating body. Read operations involving the storage cells selectively include a writeback operation of sensed data associated with a given read command. By selectively carrying out writeback operations, power dissipation may be significantly reduced while maintaining the benefits of a writeback operation to address sense voltage attenuation over multiple read operations. Such significant power reduction benefits may be especially useful for applications such as quantum computing.

Figure 1:
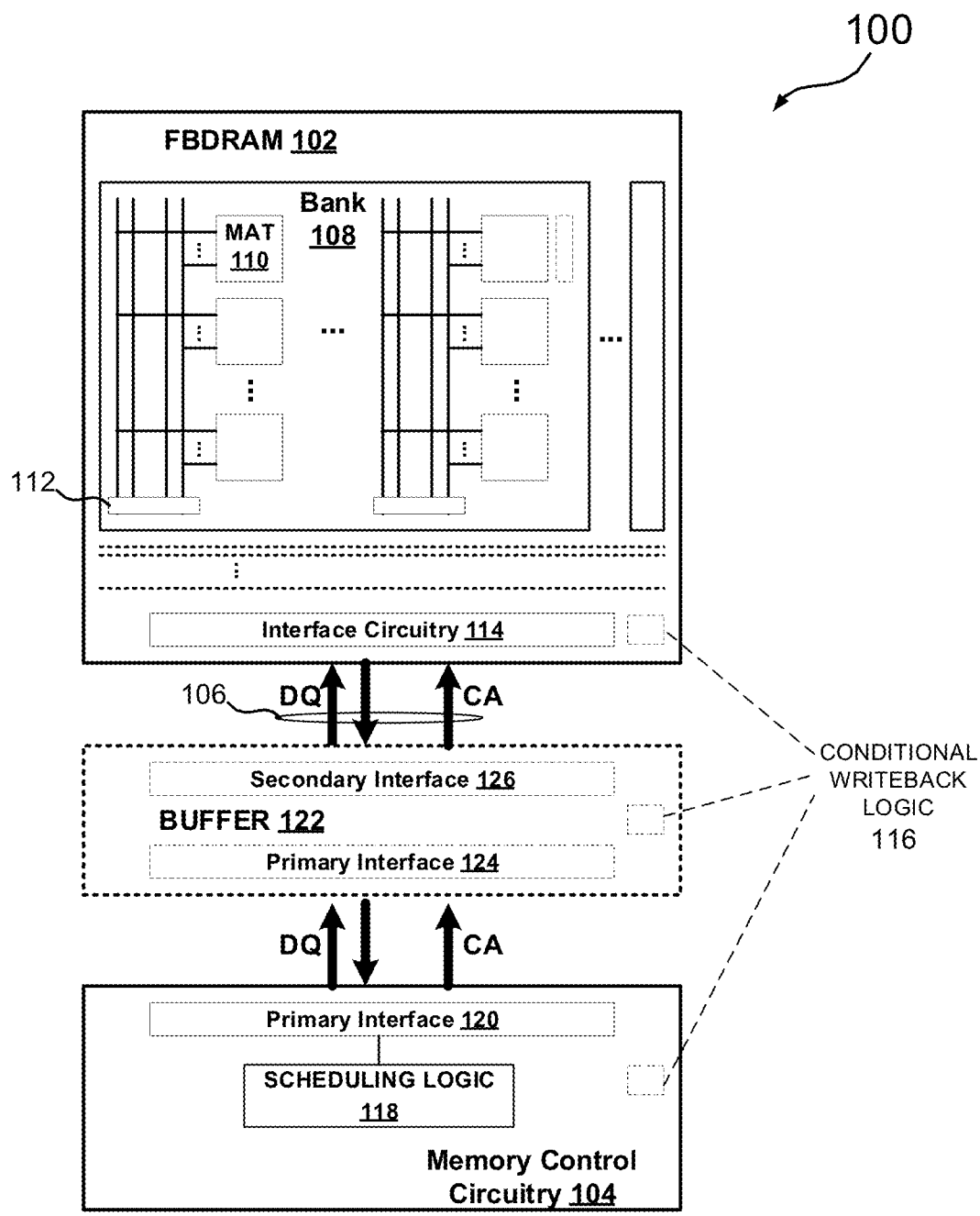
FIG. 1 illustrates one embodiment of a memory system that employs a memory controller, a floating body memory device, and an optional buffer device.

Referring to FIG. 1, one embodiment of a memory system, generally designated 100, employs at least one memory device 102 coupled to memory control circuitry 104 via a signaling link 106. For one embodiment, the memory device 102 may be an integrated circuit (IC) chip of the type that includes floating body storage components such as floating body dynamic random access memory (FBDRAM). The architecture described herein renders it possible to significantly minimize power dissipation during FBDRAM access operations.

With continued reference to FIG. 1, one specific embodiment of the memory device 102 may include, e.g., memory core circuitry including one or more memory banks 108 that are organized into plural memory units or mats 110. A mat may be viewed as an independent array of FBDRAM storage cells, along with associated row and column decoder logic, and sense amplifier resources 112.

Although only one memory device is shown in FIG. 1, multiple memory devices may be organized into one or more ranks of memory on a memory module substrate (not shown). The memory core circuitry 108 may be accessed via interface circuitry 114. In one embodiment, the interface circuitry includes a primary interface to exchange data (DQ), timing (not shown), and command, address, and control (CA) signals with the memory control circuitry 104 via respective data, timing and control (CA) signaling paths that form the signaling link 106. In other embodiments, the interface may be realized as a secondary interface that exchanges signals with an optional buffer device, described below.

With continued reference to FIG. 1, for one embodiment, the memory device 102 includes conditional writeback logic 116. The conditional writeback logic 116 includes one or more circuits that provide the FBDRAM with the ability to conditionally perform writeback sequences as part of read operations. Further details regarding various embodiments of the conditional writeback logic are provided below.

The memory control circuitry 104 may be realized as a discrete memory controller separate from a requestor integrated circuit (IC), or any IC that controls FBDRAM memory devices, and could be any type of system-on-chip (SoC). The memory control circuitry 104 generally includes scheduling logic 118 that generates and dispatches data, command and control signals into memory read and write sequences of operations. A primary interface 120 transmits and receives signals to and from the FBDRAM 102. For one embodiment, instead of residing in the FBDRAM 102, the conditional writeback logic 116 resides in the memory control circuitry 104.

For some embodiments, the memory system 100 may include one or more buffer IC devices 122. The buffer IC device 122 includes a primary interface 124 to exchange signals with the memory control circuitry 104, and a secondary interface 126 to exchange signals with the FBDRAM memory device 102. For one embodiment, instead of residing in the FBDRAM 102, or memory control circuitry 104, the conditional writeback logic 116 may reside in the buffer IC device 122.

Figure 2:
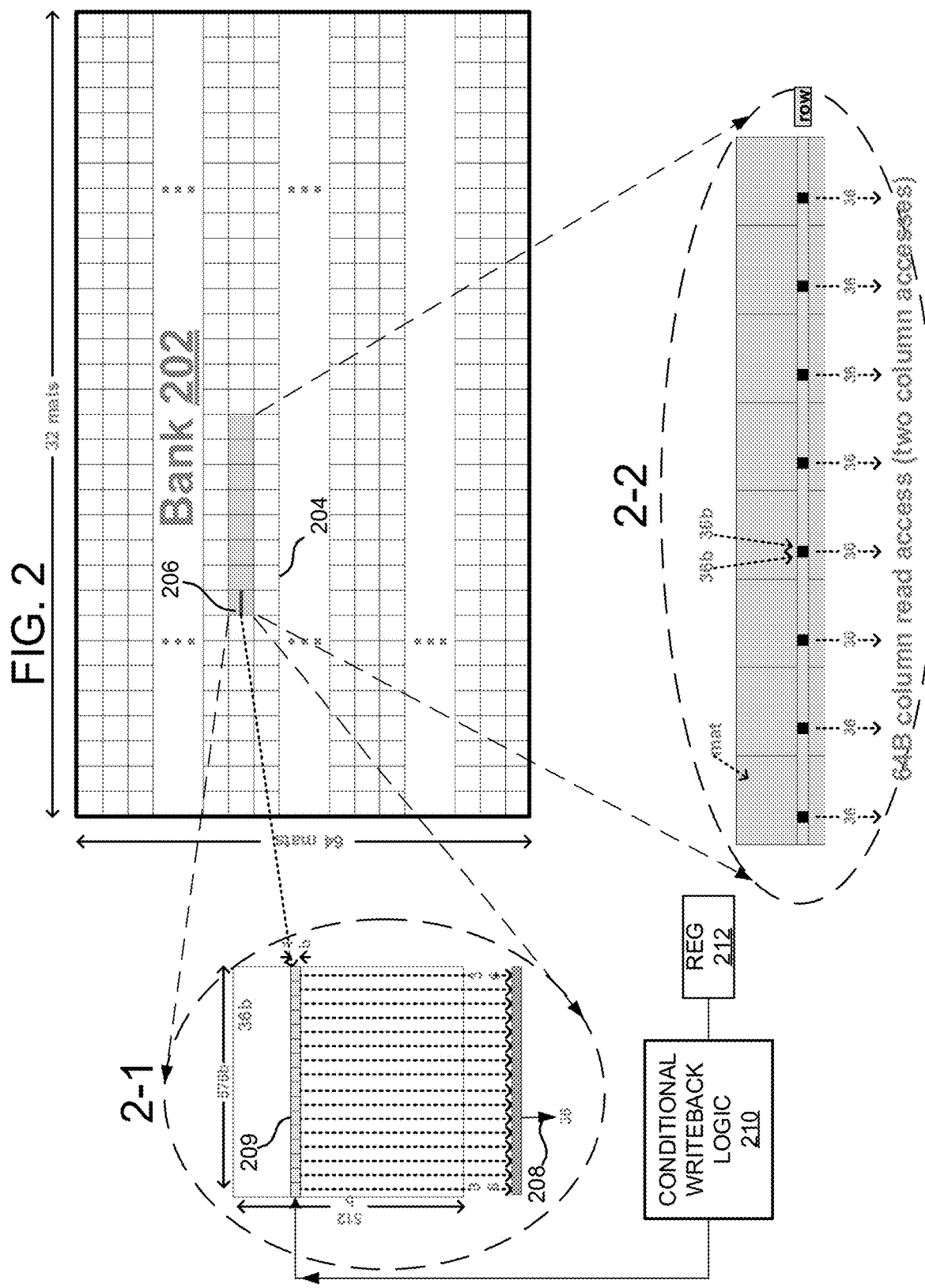
FIG. 2 illustrates one embodiment of a logical bank architecture for a floating body memory device for use in the memory system of FIG. 1.

FIG. 2 illustrates additional detail of an architecture for one embodiment of a logical bank 202 that may be employed by the FBDRAM 102 of FIG. 1. Each bank 202 may include, for example, a 64×32 array of mats 204. Each mat includes portions of wordlines or sub-rows, such as at 206, and bitlines. View 2-1 shows a single mat and a highlighted portion of a wordline corresponding to an addressed row for a read operation. During the operation, a selected column of the addressed wordline, at 209, including thirty-six bits of data, is accessed, resulting in a stream of the 36 bits, at 208. Conditional writeback logic 210 is also shown, along with storage in the form of a register 212 to store threshold values used by certain embodiments of the conditional writeback logic. A portion of a column read access involving multiple mats and associated sub-columns is shown in view 2-2.

With continued reference to FIG. 2, one embodiment of the conditional writeback logic is in the form of a random number generator. The random number generator may be programmed with a 1/N probability of generating a writeback enable signal, resulting in an activate-read (ACT-RD) sequence of operations that includes a writeback operation. The probability of no writeback signal is (N-1)/N. The register 212 may store the value of N, for retrieval by the random number generator.

As noted above, the conditional writeback logic 210, such as the random number generator, may be employed in the FBDRAM 102, in the memory control circuitry 104, or in the optional buffer IC device 106. When residing in the FBDRAM, and according to one embodiment, a timing interval representing a row cycle time (tRC) is of a consistent duration for read operations whether or not a writeback operation takes place. For implementations where the random number generator resides in the memory control circuitry, the effect of the writeback signal from the random number generator may cause an altered command sequence that includes a writeback command that follows respective activate (ACT) and read (RD) commands. In other words, when employed by the memory control circuitry, the random number generator may cause the controller to issue an activate-read-writeback (ACT-RD-WB) of operations every 1/N read accesses for a given row. Otherwise, read accesses to the row involve an activate-read (ACT-RD) sequence of operations. The number N may be based on an estimated determination of sense voltage attenuation after a certain number of accesses to a given row. By randomly carrying out writeback operations at a probability of 1/N, power dissipation due to sensing operations may be significantly reduced.

Figure 3:
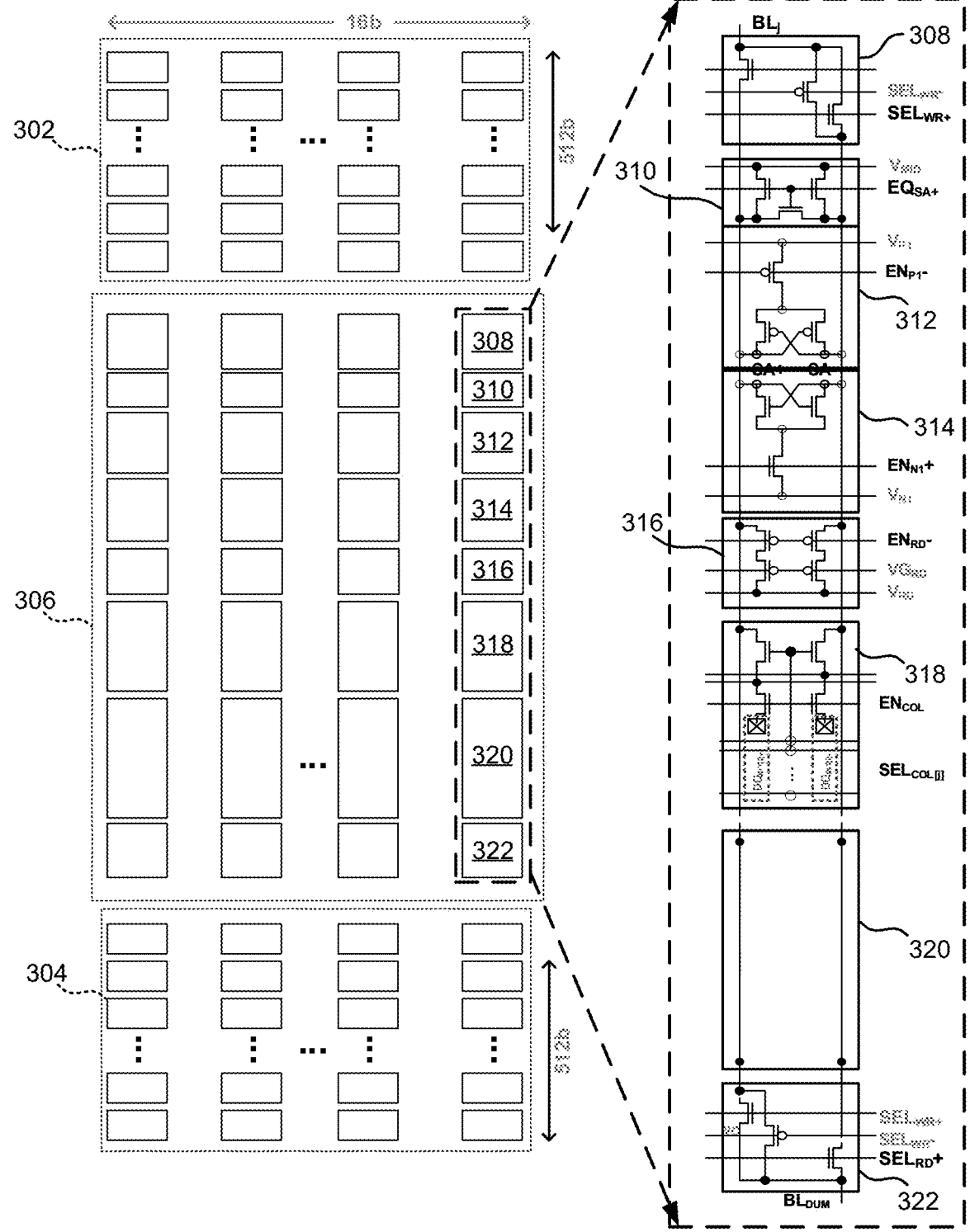
FIG. 3 illustrates further detail of one embodiment of a mat employed in the logical bank architecture of FIG. 2.

FIG. 3 illustrates further detail regarding one embodiment of a mat layout in terms of the interface circuitry involved in sensing data stored in FBDRAM cells. The left side of FIG. 3 generally shows FBDRAM storage cells blocks 302 and 304, and centrally disposed interface blocks 306. View 3-1 provides a magnified view of a section of the interface blocks, representing a sense path of logic involving the sensing of data from a given addressed wordline and bitline. At 308, a write select block is shown, responsive to a write select signal $SEL_{WR}$ that is used for selecting a bitline for writeback operations. An equalizing block 310 couples to the write select block and equalizes sense amplifier blocks 312 and 314 responsive to an equalizing signal $EQ_{SA}$. The sense amplifier blocks 312 and 314 are responsive to respective enable signals $EN_{P1}/EN_{N1}$ received by enable block 316 to sense the sensing voltage on the selected bitline. The sensed voltage may be provided as data to respective data pads DQ, at data block 318. The conditional writeback logic, such as at 320, may then generate a writeback signal to trigger the write select logic to provide a writeback signal to write the sensed data back to the FBDRAM cells involved in the read operation. The writeback operation restores the sense voltage to its pre-attentuated level. A dummy load is provided by dummy block 322.

Figure 4:
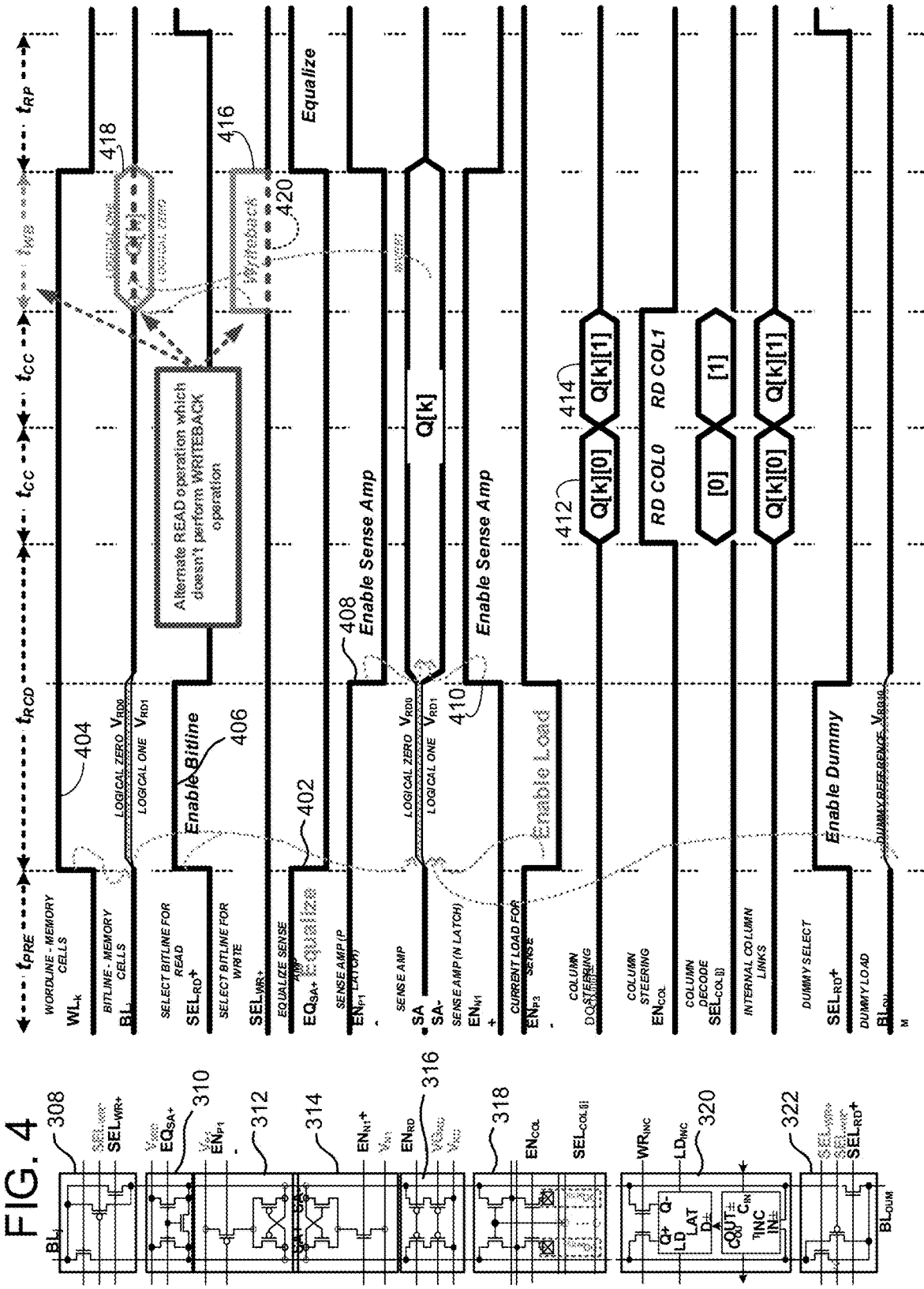
FIG. 4 illustrates a timing chart for various operations involved in a read data transfer for the memory system of FIG. 1.

Referring now to FIG. 4, a timing chart is shown that illustrates one embodiment of the timing involved for a read operation involving the FBDRAM of FIG. 1, consistent with the sensing circuitry described above with respect to FIG. 3. At the top of the timing chart, various timing intervals are labeled that correspond to typical baseline timing parameters involved in FBDRAM memory operations. For example, a precharge timing interval corresponds to the label $t_{PRE}$, while $t_{RCD}$ corresponds to the row address to column address delay. A minimum column access time interval is represented by the label $t_{CC}$. A writeback time interval is shown as $t_{WB}$, while a row precharge time is indicated by the label $t_{RP}$. The various waveforms shown below the timing parameter labels correspond to various "wordline", "bitline" "select", "enable", and other signals utilized in a read operation sequence. The sensing circuitry of FIG. 3 is shown to the left of the timing chart as an aid in understanding the relationship between the various signals shown in the timing chart.

Further referring to FIG. 4, during the precharge interval, $t_{PRE}$, which involves closing a current row, and activating a new one, the sense amplifiers in the FBDRAM core circuitry undergo an equalizing step, such as at 402, in response to the equalizing signal $EQ_{SA}$. Upon concluding the precharge interval, and initiating the $t_{RCD}$ interval, wordline WL and select bitline SEL waveforms, at 404 and 406, go high, followed by sense amplifier enable signals $EN_{P1}/EN_{N1}$, at 408 and 410. Within each $t_{CC}$ interval, a given column of data, such as Q[k][0] and Q[k][1], is sensed by the sense amps, at 412 and 414.

With continued reference to FIG. 4, the sensing of the read data involves a certain amount of attenuation to the sensing voltage. The attenuation may be addressed via a writeback operation, via a writeback signal $SEL_{WR+}$, at 416, to cause a writeback, at 418. However, each writeback operation involves a certain amount of power dissipation, and may not be necessary due to the reduced sense voltage attenuation characteristics of FBDRAMs. Thus, selective writeback operations in appropriate operating modes may be beneficial to reduce power while still addressing the attenuation caused by destructive read operations. FIG. 4 shows such a selectiveness, by indicating an optional non-writeback during the writeback interval $t_{WB}$, indicated by the dashed-line unchanged signal waveform, at 420.

Figure 5:
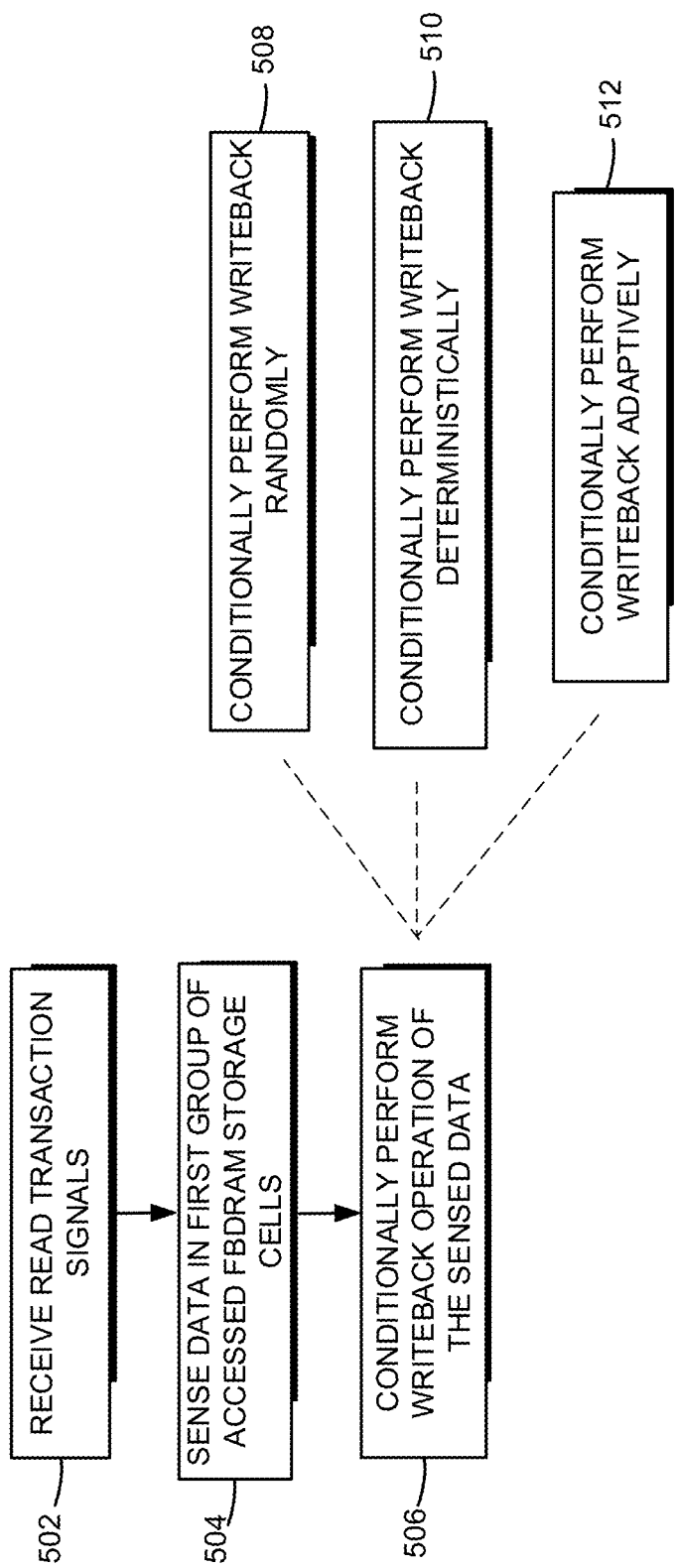
FIG. 5 illustrates one embodiment of a flow chart of steps involving a conditional writeback operation for a read data transfer between the memory controller and the memory device of FIG. 1.

FIG. 5 illustrates a flowchart outlining the steps discussed above regarding read operations for an FBDRAM memory. At 502, the memory device receives read transaction signals generated by the memory control circuitry. The read transaction signals may be transmitted directly from the memory control circuitry, or retransmitted via the optional buffer IC device. The memory core circuitry then activates an addressed row and column to sense data in response to the read transaction commands, in a first group of accessed FBDRAM storage cells, at 504. Following sensing of the data, a writeback operation may be conditionally performed, at 506.

For one embodiment, and with continued reference to FIG. 5, the conditional writeback operation may be performed randomly, at 508, consistent with the random generator described above with respect to the memory device of FIG. 2. In other embodiments, the conditional writeback operation may be performed deterministically, such as at 510. In yet other embodiments, the conditional writeback operation may be carried out adaptively, such as at 512. Further detail regarding the deterministic and adaptive writeback approaches are explained below.

Figure 6:
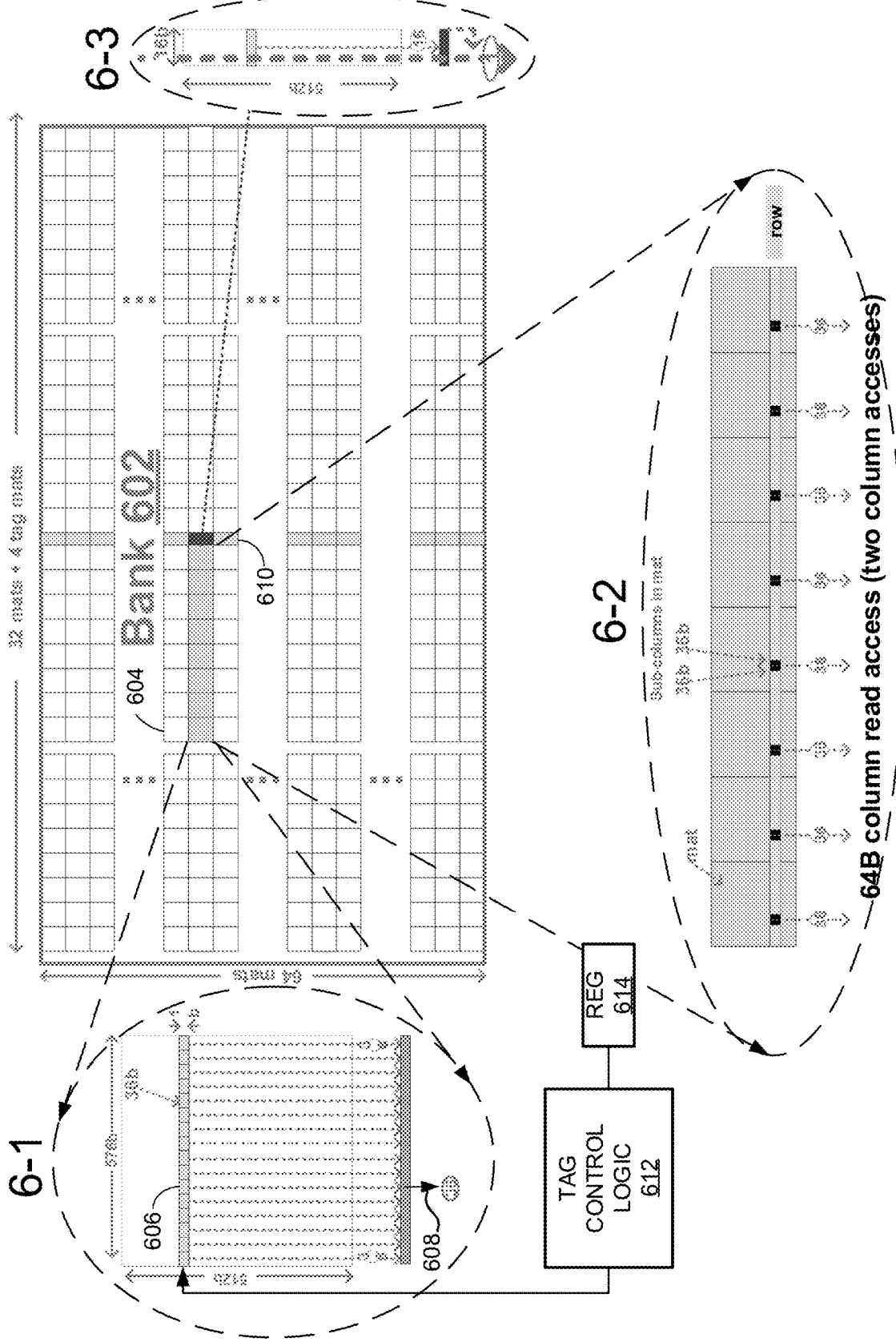
FIG. 6 illustrates a further embodiment of a logical bank architecture for a floating body memory device similar to the one shown in FIG. 2, and including tag storage cells.

Referring now to FIG. 6, an alternative bank architecture, generally designated 600, includes a bank 602 of memory core and interface circuitry organized into mats 604, similar to how the architecture of FIG. 2 is organized. Each bank 602 may include, for example, a 64×32 array of mats having storage cells for storing read/write data and interface circuitry for accessing the data stored in the storage cells. A given column access mat may be seen in view 6-1, where a portion of an addressed row 606, including thirty-six bits of data, is accessed, resulting in a stream of the 36 bits, at 608. Multiple streams of thirty-six bits, from different mats accessed during the same row access operation, are shown in view 6-2. However, the bank architecture of FIG. 6 includes additional mat resources 610 that are allocated to store count tag information such as a count value. A portion of a count tag is illustrated in view 6-3, where a 16 bit tag is accessed during a memory read access.

With continued reference to FIG. 6, the bank architecture employs tag control logic 612 that processes count information for the count tag each time a read operation occurs for a given wordline. Storage in the form of a register 614 may store a count value M representing a threshold for comparison purposes. In some embodiments, the tag control logic 612 retrieves the count tag for each read transaction, increments the tag count, and compares the count to the programmed value M. If the count meets or exceeds the predetermined value, then a control signal may be generated that results in a writeback operation for the entire wordline. If the count is less than the predetermined value (M), then the incremented count is written back into the tag mat resource from where the count was originally retrieved. The value M may be based on an expected deterministic number of actual read operations involving a given wordline and may provide tighter accuracy margins by ensuring that a writeback operation occurs within a certain number of read cycles.

For one embodiment, the tag control logic 612 may be configured to cooperate with error code logic (not shown), to calculate a parity count of the read data. The register 614 may be programmed to store, for example, the parity of the data as written into the accessed wordline or portion thereof. A conditional writeback operation may then be triggered in response to a result between a comparison between the actual parity and the expected parity, indicating that a retention-related error has occurred. This approach mitigates the probability that additional retention-related errors may exceed a system ECC correctable error threshold.

Figure 7:
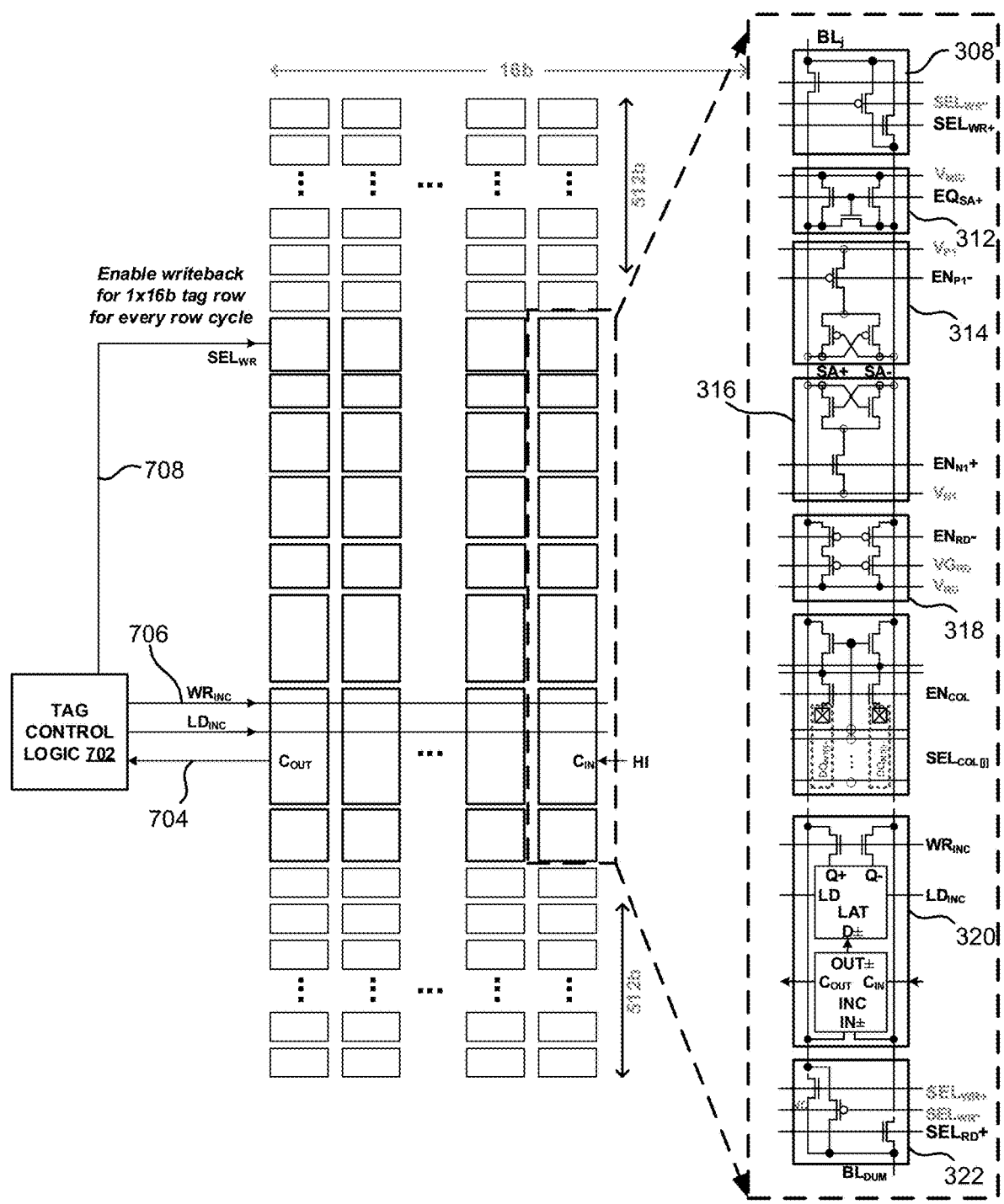
FIG. 7 illustrates one embodiment of row sense circuitry for the bank architecture of FIG. 6.

FIG. 7 illustrates further detail of storage and interface circuitry for an exemplary tag such as that shown in view 6-3. For one embodiment, the tag storage may be 16 bits wide, and 512 bits deep. Interface circuitry blocks corresponding to those described in FIG. 3 are also included, and shown on the right side of FIG. 7. In general, tag control logic 702 reads the tag, at 704, each time an associated wordline is accessed for a read operation. The tag is then incremented, at 706, to reflect a count of the number of read operations carried out with respect to that wordline, and written to the tag storage for the addressed wordline. If the tag count meets or exceeds the threshold value, then a writeback control signal is generated, at 708. For one embodiment, during write operations, a writeback of the tag occurs for every write operation. In some embodiments, during write operations, the tag may be optionally cleared.

Figure 8:
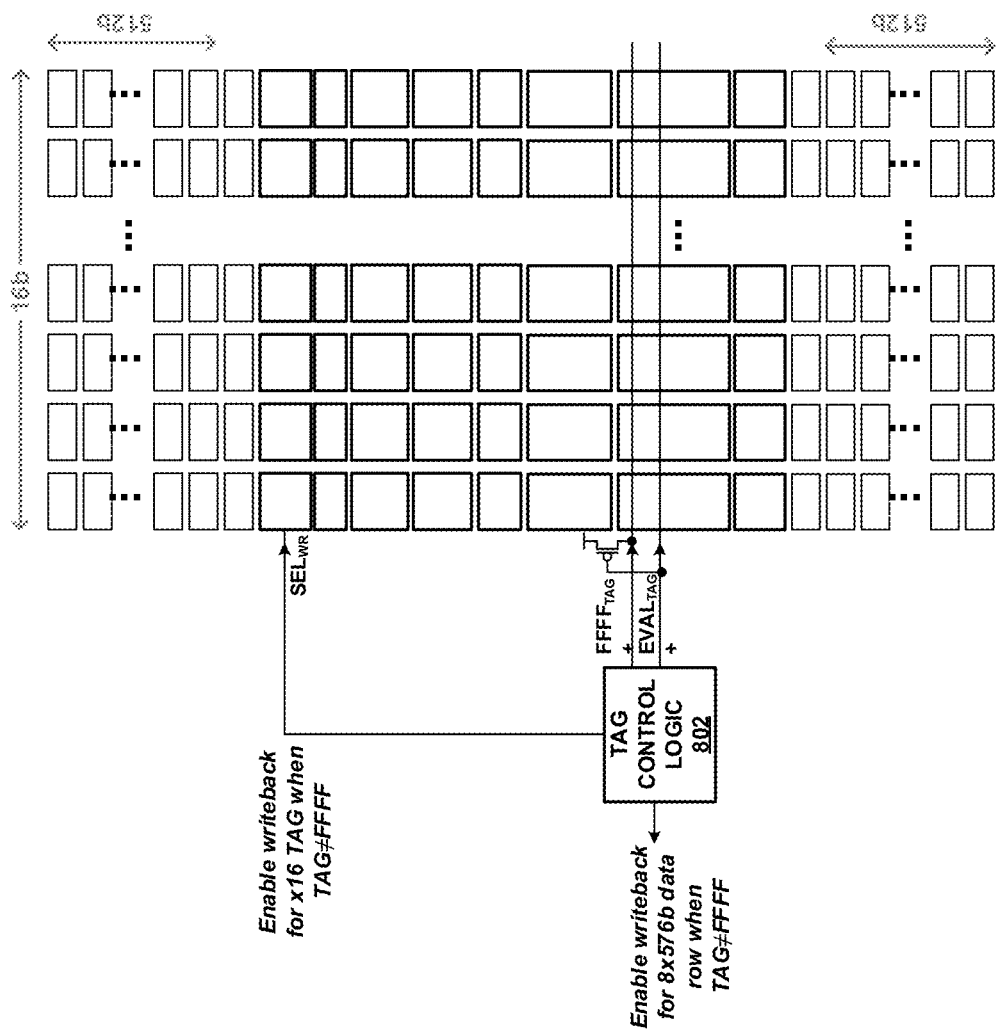
FIG. 8 illustrates a further embodiment of row sense circuitry similar to that of FIG. 7.

An alternative embodiment to the tag count approach involves circuitry to adaptively carry out selective writeback operations. Referring now to FIG. 8, tag mat resources may be employed that intentionally exhibit weaker storage or sense capabilities than those of the primary memory core. One embodiment to exhibit a weaker sense signal involves injecting less charge into the mat cells during writes. A further embodiment involves running less current through a sense amplifier that senses the tag mat storage cells. Another embodiment employs a different sense amplifier reference voltage for sense amplifiers associated with the tag mat cells. Tag logic 802 is employed to manage the adaptive tag functionality. For a read operation to a given wordline, the tag control logic 802 retrieves the most recently stored tag and compares it to a reference tag that, for example, includes all logic "1" bit values. If the retrieved tag fails to exhibit all logic "1"s, then the tag control logic 802 adapts to the failure by carrying out a wordline writeback operation and resetting the tag. This approach provides a way to adaptively carry out selective writeback based on actual exhibited characteristics of the memory cells that may change over time.

The various memory system embodiments described above lend themselves well to high-performance, low-power applications, such as quantum computing. Operating under cryogenic temperatures from between approximately 123K to absolute zero, quantum computing involves significant power constraints for various systems, such as main memory. Utilizing FBDRAM devices, coupled with selective writeback for memory read operations, enables significant memory system power savings.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory controller, comprising: a transfer interface to transmit a read command to access first read data stored in a first group of floating body storage cells; conditional writeback circuitry coupled to the transfer interface, the conditional writeback circuitry to generate a writeback command in response to one of a predetermined probability, a threshold count of a number of accesses to the first group of the storage cells, or a tag value exhibiting a first sense characteristic; and wherein the transfer interface is configured to conditionally perform a writeback operation of sensed data associated with the read command in response to the writeback command generated by the conditional writeback circuitry.

2. The memory controller of claim 1: wherein the conditional writeback circuitry generates the writeback command randomly based on the predetermined probability.

3. The memory controller of claim 2, wherein the conditional writeback circuitry further comprises: a control register to store a value N corresponding to the predetermined probability.

4. The memory controller of claim 3, wherein the conditional writeback circuitry further comprises: a random signal generator configured to generate the writeback command with the predetermined probability based on the relationship 1/N.

5. The memory controller of claim 1, wherein the conditional writeback circuitry further comprises: circuitry to generate the threshold count of the number of accesses to the storage cells, the threshold count stored as a tag.

6. The memory controller of claim 5, wherein the conditional writeback circuitry further comprises: a control register to store a value M corresponding to the threshold count; and wherein the conditional writeback circuitry generates the writeback command when the threshold count is reached or exceeded.

7. The memory controller of claim 1, further comprising: circuitry to generate a parity count for read data accessed from the first group of the storage cells; and wherein the conditional writeback circuitry selectively generates the writeback command based on the parity count.

8. The memory controller of claim 7, further comprising: a control register to store a parity value corresponding to data written to the first group of the storage cells; and wherein the conditional writeback circuitry selectively generates the writeback command when the parity count differs from the parity value.

9. The memory controller of claim 1, wherein the conditional writeback circuitry further comprises: circuitry to compare the tag value to a reference value; and wherein the conditional writeback circuitry selectively generates the writeback command based on the comparison.

10. The memory controller of claim 1, wherein: the transfer interface and the conditional writeback circuitry are configured to operate at cryogenic temperature.

11. A method of operation in an integrated circuit (IC) memory controller, the method comprising:
   transmitting read transaction component signals for accessing a first group of floating body dynamic random access memory (FBDRAM) storage cells, the read transaction component signals including an activate command and a read command;
   conditionally generating a writeback command with conditional writeback circuitry, the conditional writeback circuitry generating the writeback command in response to one of a predetermined probability, a threshold count of a number of accesses to the first group of the storage cells, or a tag value exhibiting a first sense characteristic; and
   performing a writeback operation of sensed data associated with the read command in response to the writeback command.

12. The method of claim 11, wherein:
   conditionally generating the writeback command is carried out randomly based on the predetermined probability.

13. The method of claim 12, further comprising:
retrieving a value N from a control register, the value N corresponding to the predetermined probability; and
generating the writeback command with a random signal generator based on the relationship 1/N.

14. The method of claim 11, further comprising:
generating the threshold count of the number of accesses to the first group of the FBDRAM storage cells, the threshold count stored as a tag; and
wherein the conditional writeback circuitry conditionally generates the writeback command based on the threshold count.

15. The method of claim 14, further comprising:
retrieving a predetermined threshold value from a control register;
comparing the threshold count to the predetermined threshold value; and
generating the writeback command based on whether the threshold count meets or exceeds the predetermined threshold value.

16. The method of claim 11, wherein data written to the first group of the FBDRAM storage cells exhibits a second sense characteristic, and wherein a second group of the FBDRAM storage cells stores a tag value that is accessed each time a read operation for the data in the first group of the FBDRAM storage cells takes place, the tag value exhibiting the first sense characteristic that is less than the second sense characteristic, further comprising:
retrieving the tag value from the second group of the FBDRAM storage cells;
comparing the tag value to a reference value; and
generating the writeback command based on the comparing.

17. The method of claim 11, further comprising:
operating the IC memory controller at cryogenic temperature.

18. A memory comprising:
a memory device including storage cells, each storage cell formed with a metal-oxide-semiconductor (MOS) transistor having a floating body, wherein data is stored as charge in the floating body;
memory control circuitry to issue a read command to the memory device, the memory control circuitry including a transfer interface to receive a read command to access first data stored in a first group of the storage cells; and
wherein the transfer interface conditionally performs a writeback operation associated with the read command in response to a writeback command generated by conditional writeback circuitry disposed in the memory control circuitry, the conditional writeback circuitry generating the writeback command in response to one of a predetermined probability, a threshold count of a number of accesses to the first group of the storage cells, or a tag value exhibiting a sense characteristic.

19. The memory of claim 18, wherein the memory control circuitry further comprises:
a control register to store at least one of a value N corresponding to the predetermined probability, the threshold count of the number of accesses to the first group of the storage cells, and a parity value corresponding to data written to the first group of the storage cells.

20. The memory of claim 18, configured to operate at cryogenic temperature.

* * * * *